(12) United States Patent
Sumita et al.

(10) Patent No.: US 6,225,704 B1
(45) Date of Patent: May 1, 2001

(54) FLIP-CHIP TYPE SEMICONDUCTOR DEVICE

(75) Inventors: Kazuaki Sumita; Kimitaka Kumagae; Miyuki Wakao; Toshio Shiobara, all of Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/499,022

(22) Filed: Feb. 7, 2000

(30) Foreign Application Priority Data

Feb. 12, 1999 (JP) .................................................. 11-033729

(51) Int. Cl.$^7$ .................................................. H01L 23/29
(52) U.S. Cl. .......................... 257/789; 257/783; 257/795; 257/778
(58) Field of Search .................................... 257/782, 783, 257/789, 795, 787, 778

(56) References Cited

U.S. PATENT DOCUMENTS

| | | |
|---|---|---|
| 4,999,699 | 3/1991 | Christie . |
| 5,001,542 * | 3/1991 | Tsukagoshi et al. . |
| 5,089,440 | 2/1992 | Christie . |
| 5,292,688 | 3/1994 | Hsiao . |
| 5,928,595 | 7/1999 | Knapp . |
| 5,959,362 * | 9/1999 | Yoshino . |
| 6,060,782 * | 5/2000 | Ohsono et al. . |
| 6,081,038 * | 6/2000 | Murayama . |
| 6,100,597 * | 8/2000 | Nakamura . |
| 6,137,183 * | 10/2000 | Sako . |

\* cited by examiner

*Primary Examiner*—Sheila V. Clark
(74) *Attorney, Agent, or Firm*—Birch, Stewart, Kolasch & Birch, LLP.

(57) ABSTRACT

A flip-chip type semiconductor device has a semiconductor chip mounted on a substrate via a plurality of bumps. The gap between the substrate and the chip is filled with an underfill material and sealed along sides thereof with a fillet material. The underfill material is a cured epoxy resin composition comprising a liquid epoxy resin and an inorganic filler, having a coefficient of expansion of 20–40 ppm/° C. below its Tg. The fillet material is a similar cured epoxy resin composition having a coefficient of expansion of less than 20 ppm/° C. below its Tg. The device is highly reliable.

2 Claims, 1 Drawing Sheet

FLIP-CHIP TYPE SEMICONDUCTOR DEVICE

This invention relates to a flip-chip type semiconductor device having a semiconductor chip mounted on a circuit pattern-bearing surface of a substrate via a plurality of bumps, the gap between the substrate and the semiconductor chip being filled with an underfill material and flanked with a fillet material.

BACKGROUND OF THE INVENTION

With the advance of electric equipment toward smaller size, lighter weight and higher performance, the semiconductor mounting technology has changed from the pin mating type to the surface mounting which now becomes the mainstream. One bare chip mounting technology is flip-chip (FC) mounting. The flip-chip mounting is a technique of providing an LSI chip on its circuit pattern-bearing surface with several to several thousands of electrodes, known as bumps, of about 10 to 100 microns high and joining the chip to electrodes on a substrate with a conductive paste or solder. Then the sealing material used for the protection of FC devices must penetrate into gaps of several tens of microns defined by bumps between the substrate and the LSI chip. Conventional liquid epoxy resin compositions used as the underfill material for flip-chip devices are generally composed of a liquid epoxy resin, a curing agent and an inorganic filler. Of these, the most predominant is a composition in which a large amount of inorganic filler is blended in order to provide a matching coefficient of linear expansion with those of semiconductor chips, substrates and bumps for increased reliability.

The flip-chip underfill materials with high loading of filler, however, suffer from very low productivity since they have a high viscosity due to the high filler loading so that they may penetrate into the gap between chip and substrate at a very slow rate. There is a desire to overcome this problem. Also recently, as semiconductor chips become large sized, more attention must be paid to the problem that not only chip cracks, but also fillet cracks occur during solder reflow, despite a matching of expansion coefficient among semiconductor chip, sealing material, organic substrate and solder bumps.

SUMMARY OF THE INVENTION

An object of the invention is to provide a flip-chip type semiconductor device wherein the gap between a chip and a substrate is filled with an underfill material in the form of a liquid epoxy resin composition having a good interstitial infiltration capability and sealed along sides thereof with a fillet material having a lower coefficient of expansion than the underfill material whereby the device becomes more reliable, especially against a thermal shock test.

It has been found that a highly reliable flip-chip type semiconductor device is obtainable using an underfill material having a coefficient of thermal expansion (CTE) of 20 to 40 ppm/° C. at temperatures below its glass transition temperature (Tg) in combination with a fillet material having a CTE of up to 20 ppm/° C. at temperatures below its Tg.

The invention provides a flip-chip type semiconductor device comprising a substrate having a wiring pattern-bearing surface and a semiconductor chip mounted on the wiring pattern-bearing surface via a plurality of bumps to define a gap between the substrate and the semiconductor chip, the gap being filled with an underfill material and sealed along sides thereof with a fillet material. The underfill material is a cured product of a first epoxy resin composition comprising a liquid epoxy resin and an inorganic filler, the cured product having a CTE of 20 to 40 ppm/° C. at temperatures below its Tg. The fillet material is a cured product of a second epoxy resin composition comprising a liquid epoxy resin and an inorganic filler, the cured product having a CTE of up to 20 ppm/° C. at temperatures below its Tg.

In the disclosure, the coefficient of thermal expansion is often abbreviated as CTE, and the glass transition temperature abbreviated as Tg.

DESCRIPTION OF THE PREFERRED EMBODIMENTS

Figure 1:
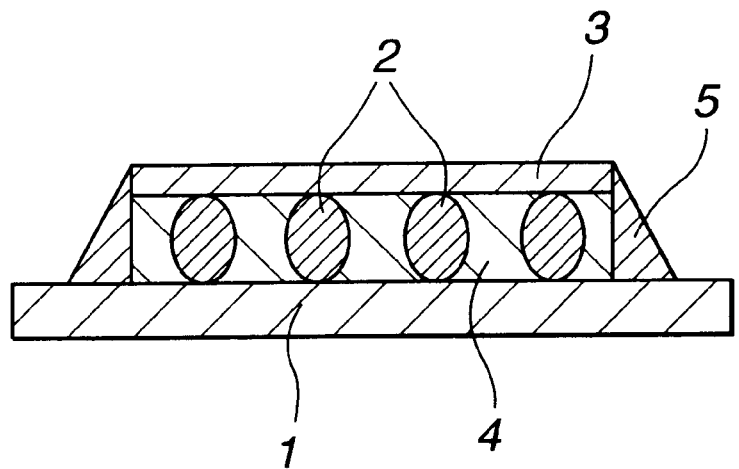
FIG. 1 is a schematic cross-sectional view of a flip-chip type semiconductor device according to one embodiment of the invention.

Referring to FIG. 1, a flip-chip type semiconductor device according to one embodiment of the invention is illustrated as comprising an organic substrate 1 having a wiring pattern-bearing surface (upper surface in the figure). A semiconductor chip 3 is mounted on the wiring pattern-bearing surface via a plurality of bumps 2 to define gaps between the substrate 1 and the semiconductor chip 3 and also between the bumps 2. The gaps are filled with an underfill material 4 and sealed along sides thereof with a fillet material 5.

Both the underfill and fillet materials 4 and 5 are formed of epoxy resin compositions comprising an epoxy resin and an inorganic filler as main components, both in cured form. The invention uses an underfill material having a coefficient of thermal expansion (CTE) of 20 to 40 ppm/° C., and especially 20 to 30 ppm/° C. at temperatures below its Tg, and a fillet material having a CTE of up to 20 ppm/° C., preferably 5 to 19 ppm/° C., and more preferably 10 to 18 ppm/° C., at temperatures below its Tg. This choice ensures that the underfill material infiltrates and fills the gaps between the substrate and the chip, imparting improved thermal shock resistance. If an underfill material has a CTE of more than 40 ppm/° C. below its Tg or if a fillet material has a CTE of more than 20 ppm/° C. below its Tg, then internal stresses are increased to such a level that undesirable cracks may occur in a thermal cycling test. If an underfill material has a CTE of less than 20 ppm/° C. below its Tg, then the difference with the CTE of solder bumps becomes substantial, inviting failures in crack resistance and moisture resistance tests.

From the standpoint of providing a coefficient of expansion within the above-defined range, the underfill material is preferably formed of a first epoxy resin composition comprising (A) 20 to 100 parts by weight of a liquid epoxy resin,
(B) 0 to 80 parts by weight of a curing agent, the amount of components (A) and (B) combined being 100 parts by weight,
(C) 100 to 400 parts by weight of an inorganic filler per 100 parts by weight of components (A) and (B) combined,
(D) 0.01 to 10 parts by weight of a curing accelerator per 100 parts by weight of components (A) and (B) combined, and
(E) a copolymer obtained through addition reaction between an epoxy or phenolic resin having alkenyl groups and an organopolysiloxane represented by the following average compositional formula (1):

$$H_aR_bSiO_{(4-a-b)/2} \quad (1)$$

wherein R is a substituted or unsubstituted monovalent hydrocarbon group, a is a positive number of 0.002 to 0.1, b is a positive number of 1.8 to 2.2, and the sum of a and b is from 1.81 to 2.3, having 20 to 400 silicon atoms and 1 to 5 SiH groups per molecule, the addition reaction taking place between alkenyl groups on the epoxy or phenolic resin and SiH groups on the organopolysiloxane, the organosiloxane units in the copolymer being 2 to 15 parts by weight per 100 parts by weight of components (A) and (B) combined.

Similarly, the fillet material is preferably formed of a second epoxy resin composition comprising (a) 20 to 100 parts by weight of a liquid epoxy resin,
(b) 0 to 80 parts by weight of a curing agent, the amount of components (a) and (b) combined being 100 parts by weight,
(c) 250 to 500 parts by weight of an inorganic filler per 100 parts by weight of components (a) and (b) combined,
(d) 0.01 to 10 parts by weight of a curing accelerator per 100 parts by weight of components (a) and (b) combined, and
(e) a copolymer obtained through addition reaction between an epoxy or phenolic resin having alkenyl groups and an organopolysiloxane represented by the following average compositional formula (1):

$$H_aR_bSiO_{(4-a-b)/2} \quad (1)$$

wherein R is a substituted or unsubstituted monovalent hydrocarbon group, a is a positive number of 0.002 to 0.1, b is a positive number of 1.8 to 2.2, and the sum of a and b is from 1.81 to 2.3, having 20 to 400 silicon atoms and 1 to 5 SiH groups per molecule, the addition reaction taking place between alkenyl groups on the epoxy or phenolic resin and SiH groups on the organopolysiloxane, the organosiloxane units in the copolymer being 2 to 15 parts by weight per 100 parts by weight of components (a) and (b) combined.

The first and second epoxy resin compositions are described in detail. The liquid epoxy resin used as component (A) or (a) may be any epoxy resin as long as it has at least two epoxy groups in a molecule. Preferred examples include bisphenol type epoxy resins such as bisphenol A type epoxy resins and bisphenol F type epoxy resins, novolac type epoxy resins such as phenol novolac type epoxy resins and cresol novolac type epoxy resins, naphthalene type epoxy resins, biphenyl type epoxy resins, and cyclopentadiene type epoxy resins. Of these, epoxy resins which are liquid at room temperature are used. Any of epoxy resins of the following structure may be added to the foregoing epoxy resins in such an amount as not to adversely affect the interstitial infiltration thereof.

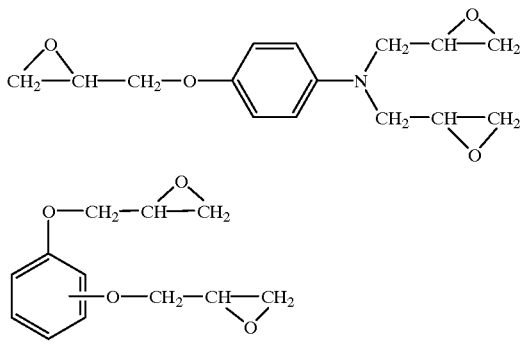

The liquid epoxy resins preferably have a total chlorine content of up to 1,500 ppm, and especially up to 1,000 ppm. When chlorine is extracted from the epoxy resin with water at an epoxy resin concentration of 50% and a temperature of 100° C. over a period of 20 hours, the water-extracted chlorine content is preferably up to 10 ppm. At a total chlorine content of greater than 1,500 ppm or a water-extracted chlorine level of more than 10 ppm, the semiconductor device would become less reliable, especially in the presence of moisture.

The above-described epoxy resin can be cured with the curing accelerator to be described later as component (D) or (d) alone. A curing agent as component (B) or (b) is used as the case may be. Typical curing agents include acid anhydrides such as methyltetrahydrophthalic anhydride, methylhexahydrophthalic anhydride, hexahydrophthalic anhydride and methylhymic anhydride, and carboxylic acid hydrazides such as dicyandiamide, adipic acid hydrazide and isophthalic acid hydrazide.

Understandably, the amount of the curing agent blended is not critical as long as it is effective for the epoxy resin to cure. Although the amount of curing agent varies with its type, an appropriate amount is such as to give 0.5 to 1.5 and especially 0.8 to 1.2 carboxylic acid groups derived from the acid anhydride groups

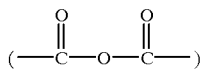

in the curing agent per epoxy group in the epoxy resin. Usually, 20 to 100 parts, especially 40 to 100 parts by weight of the liquid epoxy resin is blended with 0 to 80 parts, especially 0 to 60 parts by weight of the curing agent such that the total of the liquid epoxy resin and the curing agent may be 100 parts by weight.

Whether or not the curing agent is used, the curing accelerator as component (D) or (d) is used in the composition. Illustrative curing accelerators are imidazole derivatives such as 2-methylimidazole, 2-ethyl-4-methylimidazole, 1-cyanoethyl-2-methylimidazole, 2-phenyl-4-methyl-5-hydroxymethylimidazole, and 2-phenyl-4,5-dihydroxymethylimidazole, phosphorus derivatives, and cycloamidine derivatives. The imidazole derivatives are useful as a curing accelerator when combined with the acid anhydride curing agent while they are also useful as a curing agent for epoxy resins. An appropriate amount of the curing accelerator used is 0.01 to 10 parts, desirably 0.5 to 5 parts by weight per 100 parts by weight of the epoxy resin and curing agent combined. Less than 0.01 part of the curing accelerator may not be effective for accelerating cure whereas more than 10 parts is effective for accelerating cure, but tends to detract from storage stability. Where an acid anhydride is used as the curing agent, it is desirable that 0.3 to 0.7 mol of the acid anhydride groups be available per mol of epoxy groups in the epoxy resin. Less than 0.3 mol of the acid anhydride groups may achieve insufficient curing whereas more than 0.7 mol of the acid anhydride groups may leave a portion thereof unreacted, leading to a lowering of Tg. It is more desirable that 0.4 to 0.6 mol of the acid anhydride groups be available per mol of epoxy groups in the epoxy resin.

In the epoxy resin composition, silicone rubber, silicone oil, liquid polybutadiene rubber or a thermoplastic resin such as methyl methacrylate-butadiene-styrene copolymer may be blended for the purpose of stress reduction. The preferred stress reducing agent is a copolymer obtained through addition reaction between an epoxy or phenolic resin having alkenyl groups and an organopolysiloxane represented by the following average compositional formula (1) and having 20 to 400, preferably 40 to 200 silicon atoms and 1 to 5, preferably 1 to 3, more preferably 2 SiH groups per molecule. The addition reaction takes place between alkenyl groups on the epoxy or phenolic resin and SiH groups on the organopolysiloxane. This is component (E) or (e).

$$H_a R_b SiO_{(4-a-b)/2} \tag{1}$$

Herein R is a substituted or unsubstituted monovalent hydrocarbon group, a is a positive number of 0.002 to 0.1, preferably 0.01 to 0.1, b is a positive number of 1.8 to 2.2, preferably 1.95 to 2.05, and the sum of a and b is from 1.81 to 2.3, preferably 1.96 to 2.06 (i.e., $1.81 \leq a+b \leq 2.3$, preferably $1.96 \leq a+b \leq 2.06$).

The monovalent hydrocarbon groups represented by R are preferably those of 1 to 10 carbon atoms, especially 1 to 8 carbon atoms, for example, alkyl groups such as methyl, ethyl, propyl, isopropyl, butyl, isobutyl, tert-butyl, hexyl, cyclohexyl, octyl, and decyl; alkenyl groups such as vinyl, allyl, propenyl, butenyl, and hexenyl; aryl groups such as phenyl, xylyl and tolyl; and aralkyl groups such as benzyl, phenylethyl and phenylpropyl. Also included are halogen-substituted monovalent hydrocarbon groups wherein some or all of the hydrogen atoms in the foregoing hydrocarbon groups are replaced by halogen atoms such as chlorine, fluorine and bromine, for example, chloromethyl, bromoethyl and trifluoropropyl.

Among others, copolymers of the following structures are desirable.

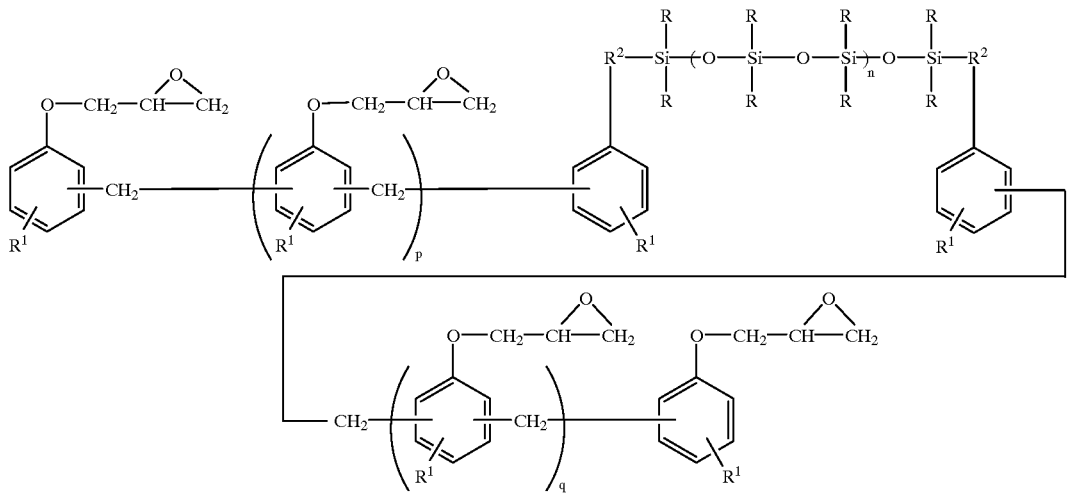

-continued

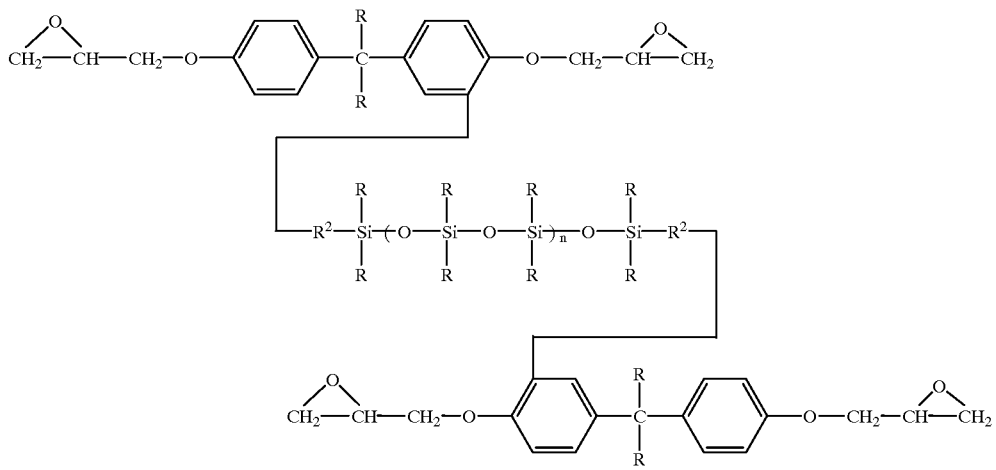

Herein, R is as defined above, R¹ is hydrogen or alkyl of 1 to 4 carbon atoms, R² is —CH₂CH₂CH₂—, —OCH₂—CH(OH)—CH₂—O—CH₂CH₂CH₂— or —O—CH₂CH₂CH₂—, letter n is an integer of 4 to 199, preferably 19 to 99, p is an integer of 1 to 10, and q is an integer of 1 to 10.

The copolymer is blended in such amounts that 0 to 20 parts, especially 2 to 15 parts by weight of the diorganopolysiloxane unit is available per 100 parts by weight of the liquid epoxy resin and the curing agent combined. Then the stress can be further reduced.

To the epoxy resin composition, a variety of well-known inorganic fillers are-added as component (C) or (c) for the purpose of reducing a coefficient of expansion. Useful inorganic fillers include fused silica, crystalline silica, alumina, boron nitride, aluminum nitride, silicon nitride, magnesia, and magnesium silicate. In order that the sealing material used as the underfill achieve both an improvement in infiltration and a reduction of linear expansion, the inorganic filler preferably has a mean particle diameter of less than about ⅟₁₀ and a maximum particle diameter of less than about ½ of the flip-chip gap width (that is the distance of the substrate-to-chip gap). Especially, the inorganic filler may usually have a mean particle diameter of 10 μm or less, preferably 0.5 to 10 μm, more preferably 1 to 5 μm, most preferably 1 to 3 μm, and a maximum particle diameter of up to 50 μm, preferably up to 45 μm. In the present invention, the mean particle diameter can be determined as a weight average value (or median diameter) by means of a particle size distribution meter using laser light diffractometry and similar analysis means.

The inorganic filler is preferably blended in an amount of about 100 to 400 parts, more desirably about 150 to 250 parts by weight per 100 parts by weight of the epoxy resin and the curing agent combined. On this basis, less than 100 parts of the inorganic filler would provide an epoxy resin composition with a greater coefficient of expansion so that cracks may be incurred in a thermal cycling test. An epoxy resin composition with more than 400 parts of the inorganic filler would be too viscous, restraining its infiltration in thin film form. For the sealing material used as the fillet, the inorganic filler preferably has a mean particle diameter of 0.5 to 30 μm, especially 1 to 20 μm, and is preferably blended in an amount of about 250 to 500 parts by weight per 100 parts by weight of the epoxy resin and the curing agent combined. On this basis, less than 250 parts of the inorganic filler would provide an epoxy resin composition with a greater coefficient of expansion so that cracks may be incurred in the fillet in a thermal cycling test. An epoxy resin composition with more than 500 parts of the inorganic filler would be too viscous and less flowable, sometimes failing to form a fillet.

In the sealing material in the form of a liquid epoxy resin composition according to the invention, various other additives are blended if necessary. Such additives include carbon-functional silanes for improving tackiness, pigments (e.g., carbon black), dyestuffs, antioxidants, and surface treating agents (e.g., γ-glycidoxypropyltrimethoxysilane).

The epoxy resin composition according to the invention can be prepared, for example, by simultaneously or separately agitating, dissolving, mixing and dispersing the epoxy resin, curing agent, curing accelerator, inorganic filler and copolymer while heating if desired. The device for mixing, agitating and dispersing the ingredients is not critical although an attritor, three-roll mill, ball mill or planetary mixer each equipped with agitating and heating means is generally used. A suitable combination of these devices is also useful.

With respect to the viscosity of the epoxy resin compositions, the liquid epoxy resin composition used as the underfill sealing material should preferably have a viscosity of less than about 10,000 poises at 25° C. Also the liquid epoxy resin composition used as the fillet sealing material should preferably have a viscosity of less than about 10,000 poises at 25° C.

A conventional method and conditions may be employed in molding or forming the sealing materials as the underfill and fillet. Preferably, the underfill is formed by molding and curing the sealing material in a heating oven at 150° C. for at least ½ hour. Less than ½ hour of heating would fail to achieve satisfactory cured characteristics. For the fillet, molding and curing under the conditions of 150° C. and at least ½ hour is recommended because less than ½ hour of heating would fail to achieve satisfactory cured characteristics.

EXAMPLE

Examples of the invention are given below by way of illustration and not by way of limitation.

Examples 1–4 and Comparative Examples 1–4

Eight epoxy resin compositions were prepared by uniformly milling the components shown in Tables 1 and 2 in a three-roll mill. The following tests were carried out on these epoxy resin compositions. The results are also shown in Tables 1 and 2.

Viscosity

Using a BH type rotating viscometer, a viscosity at 25° C. was measured at 20 rpm.

Thixotropy

Using a BH type rotating viscometer, a viscosity at 25° C. was measured at 2 rpm and 20 rpm. Thixotropy is the viscosity at 2 rpm divided by the viscosity at 20 rpm.

Gelling time

The time passed until the composition gelled on a hot plate at 150° C. was measured.

Glass transition temperature (Tg)

Using a thermomechanical analyzer (TMA), glass transition was observed while heating a cured sample of 5 mm×5 mm×15 mm at a rate of 5° C./min.

CTE-1: a coefficient of thermal expansion at temperatures below Tg.

CTE-2: a coefficient of thermal expansion at temperatures above Tg.

In the above measurement of Tg, CTE-1 was determined in the temperature range of 50 to 80° C. and CTE-2 was determined in the temperature range of 200 to 230° C.

Infiltration test

Figure 2A:
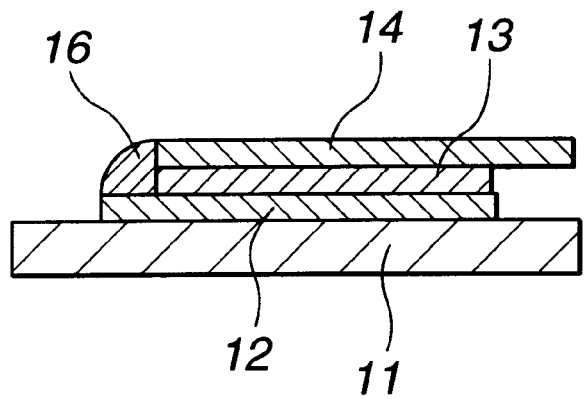
FIG. 2 illustrates a test piece used in an infiltration test, FIG. 2A being a side view and FIG. 2B being a plan view.
Figure 2B:
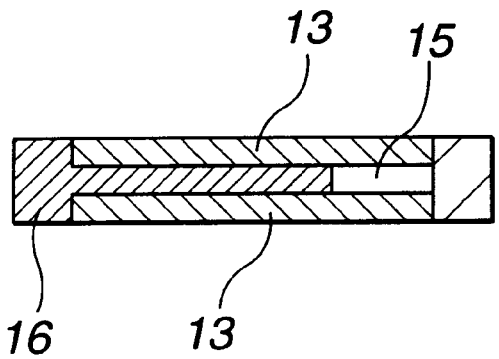

As shown in FIGS. 2A and 2B, a lower slide glass plate 12 was rested on a hot plate 11. A pair of 80-micron polyimide films 13 and 13 laterally spaced 1 cm from each other were set on the glass plate 12. An upper slide glass plate 14 was rested thereon. The slide glass plates 12, 14 defined with the two polyimide films 13, 13 an elongated space 15 having a width of 1 cm and a height of 80 $\mu$m. A mass of epoxy resin composition 16 was placed on the lower slide glass plate 12 at one end of the space 15. With this setting, the hot plate 11 was heated at 80° C. or 120° C. whereupon the epoxy resin composition 16 infiltrated through the space 15. The infiltration time was measured until the composition 16 infiltrated and reached a distance of 20 mm from the one end of the space 15.

PCT separation test

A polyimide-coated silicon chip of 10 mm×10 mm was rested on a FR-4 substrate of 30 mm×30 mm with a spacer of about 100 $\mu$m thick interposed therebetween. An epoxy resin composition for the underfill was forced to penetrate into the gap between the chip and the substrate and cured therein. The assembly was placed for 168 hours in a pressure cooker test (PCT) environment of 121° C. and 2.1 atm. Thereafter, whether the underfill separated from the chip and the substrate was observed by C-SAM.

Thermal shock test

A polyimide-coated silicon chip cut to 10 mm×10 mm and having a thickness of 0.6 mm was rested on a FR-4 substrate of 30 mm×30 mm with a spacer of about 100 $\mu$m thick interposed therebetween. An epoxy resin composition for the underfill was forced to penetrate into the gap between the chip and the substrate. Another epoxy resin composition for the fillet was applied to the sides of the chip. This assembly was heated at 150° C. for 4 hours for curing the epoxy resin compositions. The assembly was subjected to thermal cycling between −55° C. for 1 min and 160° C. for 30 sec. The assembly was observed after 50, 100 and 250 cycles. Those samples whose cured portions cracked or separated were rejected. A percent rejection was calculated as a percentage of rejected samples per 20 samples.

TABLE 1

| Composition (parts by weight) | EX1 | | EX2 | | EX3 | | EX4 | |
|---|---|---|---|---|---|---|---|---|
| Epoxy resin composition | Underfill | Fillet | Underfill | Fillet | Underfill | Fillet | Underfill | Fillet |
| Compound containing diorganopolysiloxane units of formula (1) | — | 8 | 5 | 10 | 10 | — | 5 | 5 |
| RE310 | 30 | 30 | — | 30 | 20 | 30 | 30 | — |
| RE304 | 25 | 17 | 95 | 10 | 30 | 30 | 65 | 95 |
| MH700 | 45 | 45 | — | 50 | 40 | 40 | — | — |
| SO32H | 150 | — | 200 | — | 150 | — | 200 | — |
| SE15 | — | 250 | — | 350 | — | 400 | — | 400 |
| KBM403 | 1.0 | 1.0 | 1.0 | 1.0 | 1.0 | 1.0 | 1.0 | 1.0 |
| 2PHZ-PW | — | — | 3 | — | — | — | — | — |
| 2P4MHZ-PW | — | — | — | — | — | — | 3 | 3 |
| HX3741 | 2 | 2 | — | 2 | 2 | 2 | — | — |

TABLE 1-continued

|  | EX1 | | EX2 | | EX3 | | EX4 | |
|---|---|---|---|---|---|---|---|---|
| Characteristics | | | | | | | | |
| Viscosity (poise/25° C.) | 160 | 300 | 1100 | 550 | 100 | 780 | 2000 | 4300 |
| Thixotropy | 1.01 | 1.22 | 1.02 | 1.18 | 1.01 | 1.12 | 1.03 | 1.13 |
| Gelling time (sec/150° C.) | 72 | 74 | 240 | 75 | 72 | 68 | 75 | 70 |
| Tg (° C.) | 140 | 130 | 141 | 135 | 135 | 150 | 142 | 142 |
| CTE-1 (ppm/° C.) | 30 | 18 | 25 | 16 | 29 | 12 | 25 | 12 |
| CTE-2 (ppm/° C.) | 100 | 65 | 75 | 60 | 98 | 50 | 77 | 55 |
| Infiltration time (sec/80° C.) | 80 | — | 380 | — | 90 | — | 280 | — |
| Infiltration time (sec/120° C.) | — | — | 180 | — | — | — | 180 | — |
| PCT separation test | no separation | | no separation | | no separation | | no separation | |
| Reject (%) in thermal shock test | | | | | | | | |
| after 50 cycles | 0 | | 0 | | 0 | | 0 | |
| after 100 cycles | 0 | | 0 | | 10 | | 0 | |
| after 250 cycles | 20 | | 0 | | 30 | | 0 | |

TABLE 2

|  | CE1 | | CE2 | | CE3 | | CE4 | |
|---|---|---|---|---|---|---|---|---|
| Composition (parts by weight) | | | | | | | | |
| Epoxy resin composition | Underfill | Fillet | Underfill | Fillet | Underfill | Fillet | Underfill | Fillet |
| Compound containing diorganopolysiloxane units of formula (1) | 8 | — | 5 | 10 | 10 | 10 | 5 | — |
| RE310 | 30 | — | — | — | 20 | 20 | 30 | — |
| RE304 | 17 | — | 95 | 50 | 30 | 30 | 65 | 95 |
| MH700 | 45 | — | — | 40 | 40 | 40 | — | — |
| SO32H | 150 | — | 200 | — | 100 | — | 200 | — |
| SE15 | — | — | — | 200 | — | 400 | — | 150 |
| KBM403 | 1.0 | — | 1.0 | 1.0 | 1.0 | 1.0 | 1.0 | 1.0 |
| 2PHZ-PW | — | — | 3 | — | — | — | — | — |
| 2P4MHZ-PW | — | — | — | — | — | — | 3 | 3 |
| HX3741 | 2 | — | — | 2 | 2 | 2 | — | — |
| Characteristics | | | | | | | | |
| Viscosity (poise/25° C.) | 160 | — | 1100 | 350 | 50 | 450 | 2000 | 1200 |
| Thixotropy | 1.01 | — | 1.02 | 1.18 | 1.01 | 1.12 | 1.03 | 1.13 |
| Gelling time (sec/150° C.) | 72 | — | 240 | 75 | 72 | 68 | 75 | 70 |
| Tg (° C.) | 140 | — | 141 | 135 | 135 | 150 | 142 | 150 |
| CTE-1 (ppm/° C.) | 30 | — | 25 | 24 | 41 | 12 | 25 | 35 |
| CTE-2 (ppm/° C.) | 100 | — | 75 | 86 | 128 | 50 | 77 | 105 |
| Infiltration time (sec/80° C.) | 80 | — | 380 | — | 90 | — | 280 | — |
| Infiltration time (sec/120° C.) | — | — | 180 | — | — | — | 180 | — |
| PCT separation test | no separation | | no separation | | no separation | | no separation | |
| Reject (%) in thermal shock test | | | | | | | | |
| after 50 cycles | 30 | | 10 | | 0 | | 25 | |
| after 100 cycles | 100 | | 60 | | 35 | | 60 | |
| after 250 cycles | — | | 100 | | 70 | | 100 | |

Note:
Compound containing diorganopolysiloxane units of formula (1) addition reaction product between the following two:

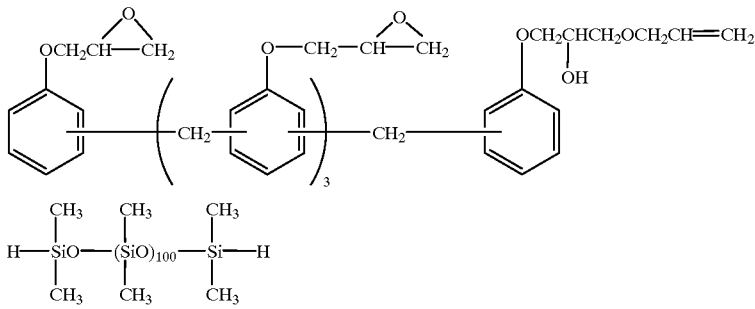

RE310: bisphenol A type epoxy resin by Nippon Kayaku K.K.

RE304: bisphenol F type epoxy resin by Nippon Kayaku K.K.

MH700: methyltetrahydrophthalic anhydride by Shin-Nippon Rika K.K.

SO32H: spherical silica having a maximum particle diameter of 45 μm and a mean particle diameter of 2 μm by Admatechs K.K.

SE15: spherical fused silica having a mean particle diameter of 15 μm by Tokuyama Soda K.K.

KBM403: γ-glycidoxypropyltrimethoxysilane by Shin-Etsu Chemical Co., Ltd.

2PHZ-PW: 2-phenyl-4,5-dihydroxymethylimidazole powder by Shikoku Chemicals K.K.

2P4MHZ-PW: 2-phenyl-4-methyl-5-hydroxymethylimidazole powder by Shikoku Chemicals K.K.

HX3741: microcapsulated catalyst containing an imidazole compound by Asahi-Ciba K.K.

There has been described a flip-chip type semiconductor device which remains highly reliable since it is underfilled with a liquid epoxy resin composition having an improved gap infiltration capability and sealed as the fillet with another liquid epoxy resin composition having a lower coefficient of expansion than the underfill.

Japanese Patent Application No. 11-033729 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A flip-chip type semiconductor device comprising a substrate having a wiring pattern-bearing surface and a semiconductor chip mounted on the wiring pattern-bearing surface via a plurality of bumps to define a gap between the substrate and the semiconductor chip, the gap being filled with an underfill material and sealed along sides thereof with a fillet material, wherein the underfill material is a cured product of a first epoxy resin composition comprising a liquid epoxy resin and an inorganic filler, having a coefficient of expansion of 20 to 40 ppm/° C. at temperatures below its glass transition temperature, and the fillet material is a cured product of a second epoxy resin composition comprising a liquid epoxy resin and an inorganic filler, having a coefficient of expansion of up to 20 ppm/° C. at temperatures below its glass transition temperature.

2. The flip-chip type semiconductor device of claim 1 wherein the first epoxy resin composition for the underfill material comprises (A) 20 to 100 parts by weight of a liquid epoxy resin, (B) 0 to 80 parts by weight of a curing agent, the amount of components (A) and (B) combined being 100 parts by weight, (C) 100 to 400 parts by weight of an inorganic filler per 100 parts by weight of components (A) and (B) combined, (D) 0.01 to 10 parts by weight of a curing accelerator per 100 parts by weight of components (A) and (B) combined, and (E) a copolymer obtained through addition reaction between an epoxy or phenolic resin having alkenyl groups and an organopolysiloxane represented by the following average compositional formula (1):

$$H_a R_b SiO_{(4-a-b)/2} \qquad (1)$$

wherein R is a substituted or unsubstituted monovalent hydrocarbon group, a is a positive number of 0.002 to 0.1, b is a positive number of 1.8 to 2.2, and the sum of a and b is from 1.81 to 2.3, having 20 to 400 silicon atoms and 1 to 5 SiH groups per molecule, the addition reaction taking place between alkenyl groups on the epoxy or phenolic resin and SiH groups on the organopolysiloxane, the organosiloxane units in the copolymer being 2 to 15 parts by weight per 100 parts by weight of components (A) and (B) combined, the second epoxy resin composition for the fillet material comprises (a) 20 to 100 parts by weight of a liquid epoxy resin, (b) 0 to 80 parts by weight of a curing agent, the amount of components (a) and (b) combined being 100 parts by weight, (c) 250 to 500 parts by weight of an inorganic filler per 100 parts by weight of components (a) and (b) combined, (d) 0.01 to 10 parts by weight of a curing accelerator per 100 parts by weight of components (a) and (b) combined, and (e) a copolymer obtained through addition reaction between an epoxy or phenolic resin having alkenyl groups and an organopolysiloxane represented by the following average compositional formula (1):

$$H_a R_b SiO_{(4-a-b)/2} \qquad (1)$$

wherein R is a substituted or unsubstituted monovalent hydrocarbon group, a is a positive number of 0.002 to 0.1, b is a positive number of 1.8 to 2.2, and the sum of a and b is from 1.81 to 2.3, having 20 to 400 silicon atoms and 1 to 5 SiH groups per molecule, the addition reaction taking place between alkenyl groups on the epoxy or phenolic resin and SiH groups on the organopolysiloxane, the organosiloxane units in the copolymer being 2 to 15 parts by weight per 100 parts by weight of components (a) and (b) combined.

* * * * *